(12) United States Patent
Afghahi et al.

(10) Patent No.: US 6,600,677 B2
(45) Date of Patent: Jul. 29, 2003

(54) MEMORY CIRCUIT CAPABLE OF SIMULTANEOUS WRITING AND REFRESHING ON THE SAME COLUMN AND A MEMORY CELL FOR APPLICATION IN THE SAME

(75) Inventors: Cyrus Afghahi, Mission Viejo, CA (US); Sami Issa, Phoenix, AZ (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/037,599

(22) Filed: Oct. 19, 2001

(65) Prior Publication Data

US 2002/0057617 A1 May 16, 2002

Related U.S. Application Data

(62) Division of application No. 09/627,757, filed on Jul. 28, 2000, now Pat. No. 6,430,098.
(60) Provisional application No. 60/204,522, filed on May 16, 2000.

(51) Int. Cl.$^7$ .............................................. G11C 11/34
(52) U.S. Cl. ................... 365/187; 365/222; 365/189.04
(58) Field of Search ................................ 365/187, 222, 365/189.04

(56) References Cited

U.S. PATENT DOCUMENTS

| | | | |
|---|---|---|---|
| 3,599,180 A | 8/1971 | Rubinstein et al. ..... 340/173 R |
| 3,699,544 A | 10/1972 | Joynson et al. ......... 340/173 R |
| 4,847,809 A | 7/1989 | Suzuki .................. 365/189.04 |
| 5,007,022 A | 4/1991 | Leigh .................... 365/189.04 |
| 5,596,545 A | 1/1997 | Lin ............................ 365/236 |
| 5,691,949 A | 11/1997 | Hively et al. .......... 365/230.03 |
| 5,808,932 A | 9/1998 | Irrinki et al. ................ 365/150 |
| RE36,180 E | 4/1999 | Lim ....................... 365/189.04 |
| 5,963,497 A | * 10/1999 | Holland ...................... 365/222 |
| 5,995,433 A | 11/1999 | Liao ............................ 365/222 |
| 5,999,474 A | 12/1999 | Leung et al. ................ 365/222 |
| 6,134,169 A | 10/2000 | Tanaka ........................ 365/222 |
| 6,233,193 B1 | * 5/2001 | Holland et al. ............. 365/222 |

* cited by examiner

Primary Examiner—Van Thu Nguyen
(74) Attorney, Agent, or Firm—Christie, Parker & Hale, LLP

(57) ABSTRACT

A system-on-chip (SOC) device or a random access memory (RAM) chip includes a RAM block. The RAM block includes memory cells, each of which has three transistors. Each memory cell is coupled to both a read bit line and a write bit line. A transparent continuous refresh mechanism has been implemented to read the content of a memory cell and re-write it back to the memory cell without disturbing the access (read/write) cycle, making refresh operations transparent to the system level. The continuous refresh mechanism includes a collision detection mechanism to prevent writing and reading the same memory cell at the same time.

18 Claims, 8 Drawing Sheets

MEMORY CIRCUIT CAPABLE OF SIMULTANEOUS WRITING AND REFRESHING ON THE SAME COLUMN AND A MEMORY CELL FOR APPLICATION IN THE SAME

CROSS REFERENCE TO RELATED APPLICATIONS

The present application is a divisional application of U.S. patent application Ser. No. 09/627,757, filed Jul. 28, 2000, now U.S. Pat. No. 6,430,098, issued Aug. 6, 2002, which claims priority of Application No. 60/204,522, filed May 16, 2000.

BACKGROUND OF THE INVENTION

System-on-chip (SOC) devices typically include internal memory for storage of information such as instructions and/or data. Internal memory blocks in an SOC device typically occupies substantial chip area of an integrated circuit (IC) chip that contains the SOC device. For example, internal memory blocks may occupy as much as about 70% of the IC chip area of an SOC device. The configuration of internal memory in SOC devices are generally similar to the configuration of memory in individual memory chips.

Memory blocks of SOC devices and memory chips used as information storage devices traditionally include read only memory (ROM) blocks, which are typically used only for reading, and random access memory (RAM) blocks, which may be written as well as read. RAM blocks typically include static random access memory (SRAM) blocks and dynamic random access memory (DRAM) blocks.

Each block of RAM includes a number of memory cells. Each memory cell typically stores one bit of information. Typical RAM blocks have capacity to store anywhere from thousands to millions of bits of data. Since vast numbers of memory cells are used to store information in RAM blocks, the size of RAM blocks depends, to large extent, on the size of each memory cell.

A conventional memory cell in the RAM block of an SOC device or an SRAM chip is typically made up of six transistors in a 6T configuration. Memory cells in DRAM blocks typically require less number of transistors per bit. For example, some DRAM blocks contain memory cells with one transistor per bit. Therefore, DRAM blocks of SOC devices and DRAM chips are typically smaller than SRAM blocks with similar information storage capacity.

SRAM blocks are generally used for fast memory access. DRAM block accesses typically are not as fast as the SRAM block accesses, and thus for applications that require fast memory accesses, such as graphics cache, SRAM blocks are generally used. SRAM blocks also have an advantage of being able to retain data bits without refreshing since data bits are typically stored in memory cells of the SRAM blocks without much charge leakage.

If a less number of transistors could be used in a RAM cell, which has a comparable speed and data reliability to SRAM cells while maintaining small size of a DRAM cell, a RAM architecture based on such RAM cell could help to reduce the size of many integrated circuit chips and packages, including SOC devices and individual RAM chips.

SUMMARY OF THE INVENTION

One embodiment of the present invention is a system-on-chip device that includes a memory block. The memory block includes a memory cell array having a plurality of memory cells organized into rows and columns. Each of the plurality of memory cells in a column is coupled to both a read bit line and a write bit line. The memory block also includes a refresh address generator for generating a refresh address. The refresh address is used to refresh the plurality of memory cells in the memory cell array.

Another embodiment of the present invention is a memory block that includes a memory cell array having a plurality of memory cells organized into rows and columns. Each of the plurality of memory cells in a column is coupled to both a read bit line and a write bit line. The memory block also includes a refresh address generator for generating a refresh address. The refresh address is used to refresh the plurality of memory cells in the memory cell array.

A collision avoidance mechanism is implemented in another embodiment of the present invention. In this embodiment, the memory block includes a comparator. The comparator is used to compare an access address and a refresh address. If the access address is the same as the refresh address. The refresh address is updated using a pre-determined algorithm.

In yet another embodiment of the present invention, an access operation using the access address and a refresh operation using the refresh address are performed substantially simultaneously. The access operation can be used to write to a first memory cell while the refresh operation reads from a second memory cell, which is on the same column as the first memory cell. In addition, the access operation can be used to read from the first memory cell while the refresh operation writes to the second memory cell.

Yet another embodiment of the present invention is a memory cell that includes a first transistor, a second transistor and a third transistor. Each of the three transistors have a gate, a first terminal and a second terminal. The first terminal of the first transistor is coupled to a write bit line. The second terminal of the first transistor is coupled to the gate of the second transistor. The second terminal of the third transistor is coupled to the first terminal of the second transistor. The first terminal of the third transistor is coupled to a read bit line.

Yet another embodiment of the present invention is a method of refreshing a memory cell while performing an access operation. An access address is provided to be used for the access operation. A refresh address is generated for a refresh operation. The access address is compared with the refresh address. If the access address and the refresh address are the same, a pre-determined algorithm is used to update the refresh address.

DETAILED DESCRIPTION OF THE INVENTION

Figure 1:
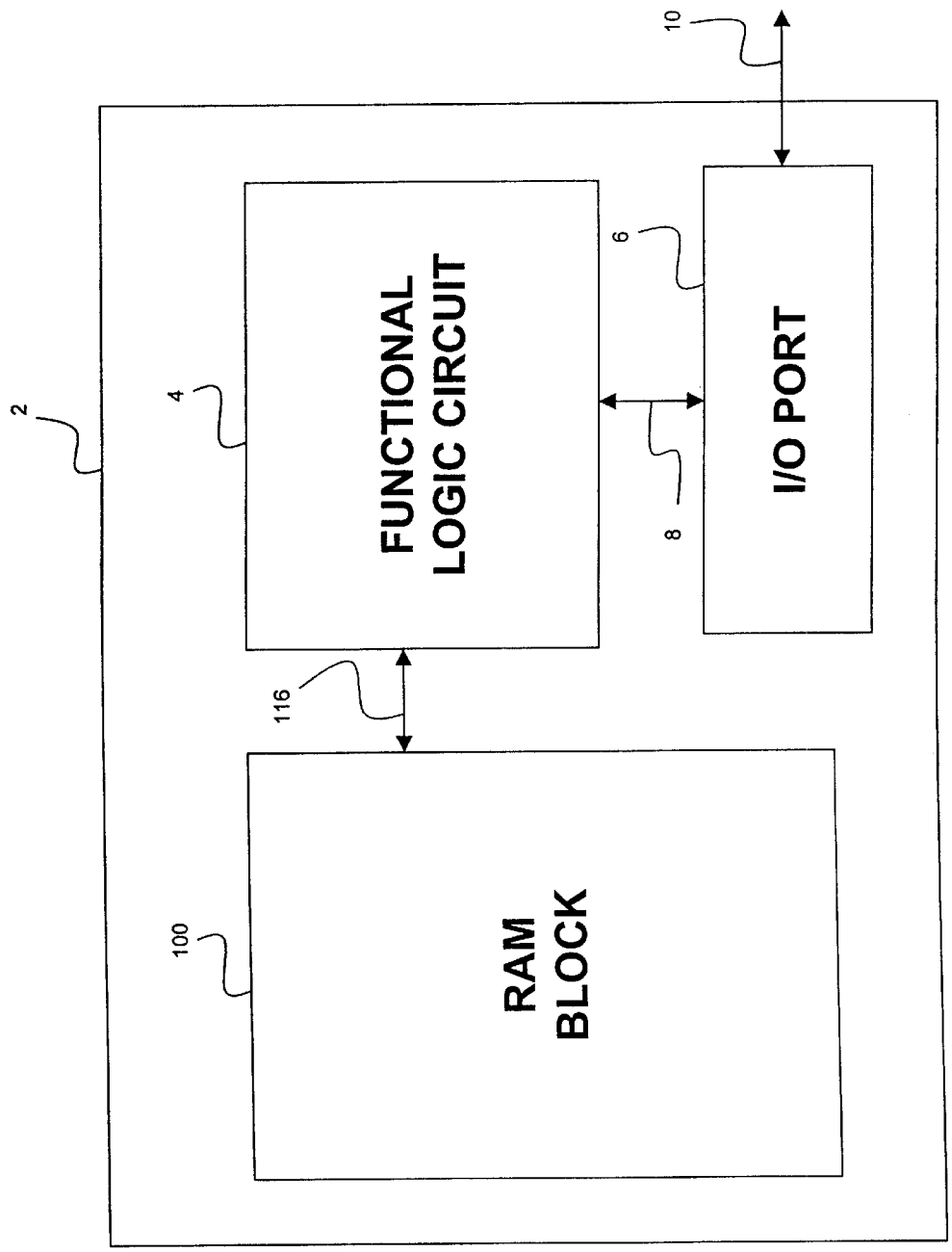
FIG. 1 is a block diagram of a system-on-chip (SOC) device that includes a random access memory (RAM) block.

FIG. 1 is a block diagram of a system-on-chip (SOC) device 2. The SOC device 2 preferably includes a functional logic circuit 4 for data processing. The functional logic circuit 4 preferably communicates with external devices using an I/O port 6 over an I/O interface 8. The I/O port 6 preferably transmits and receives data to and from the external devices over an external interface 10. The SOC device 2 preferably also includes a random access memory (RAM) block 100. The RAM block 100 may be used to store data and information for data processing by the functional logic circuit 4. The functional logic circuit preferably accesses the data and/or information used during data processing over a data bus 116.

For example, the SOC device 2 may be a high speed switch chip. In the high speed switch chip, the RAM block 100 may typically store information regarding source and destination of data packets. In the high speed switch chip, the I/O port 6 may be a transceiver for receiving and transmitting the data packets. The functional logic circuit 4 in the high speed switch chip may be used to switch or route the incoming data packets to external devices based on the information stored in the RAM block 100.

Figure 2:
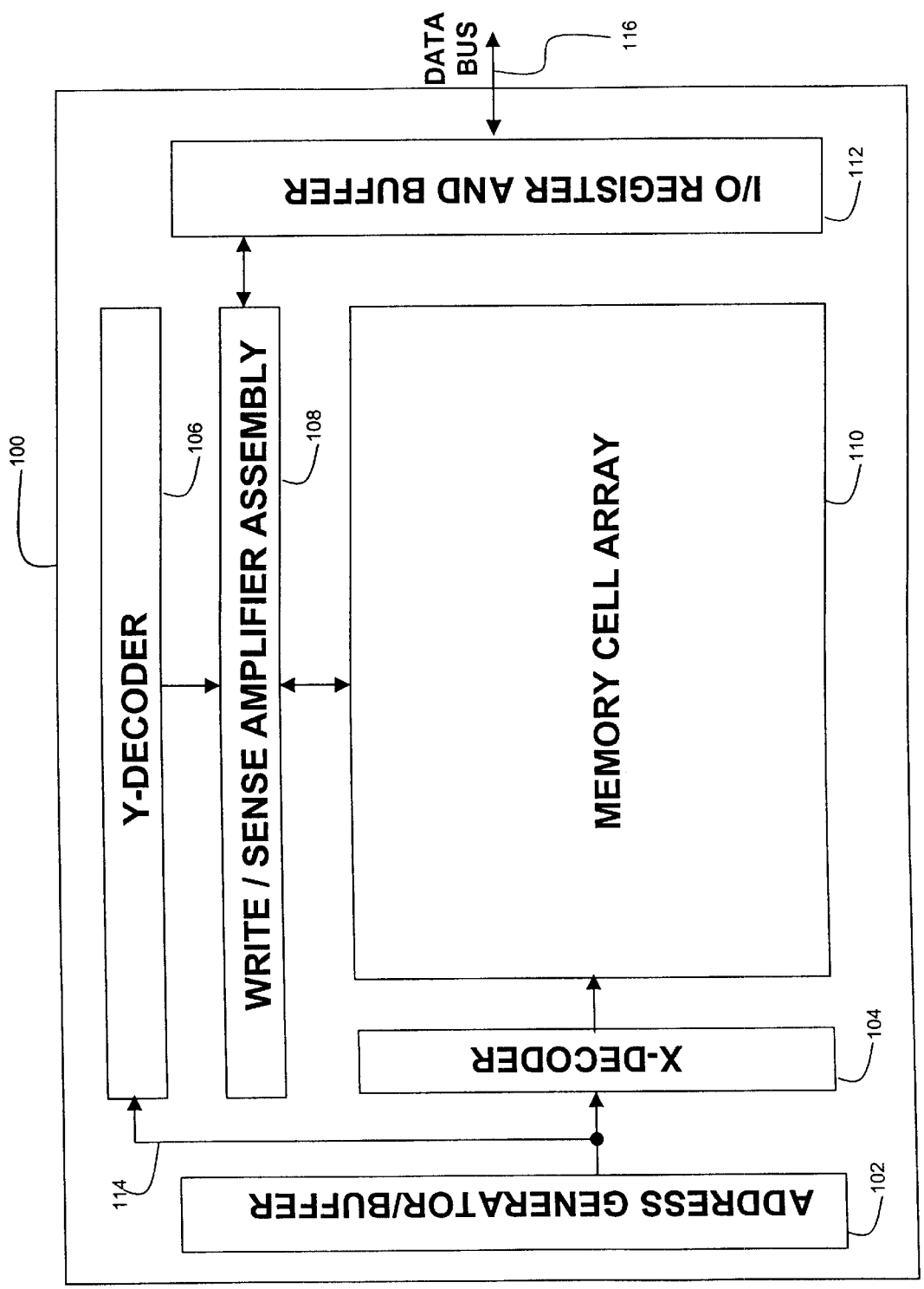
FIG. 2 is a block diagram of a RAM block of an SOC device or a RAM chip.

FIG. 2 is a block diagram of a random access memory (RAM) block 100. The RAM block 100 may be used as a part of an SOC device as in FIG. 1, or as a part of an individual RAM chip. The RAM block 100 preferably includes a memory cell array 110. The memory cell array 110 preferably includes a number of memory cells. The memory cells in the memory cell array 110 preferably are organized into rows and columns.

The RAM 100 preferably also includes a write/sense amplifier assembly 108. The write/sense amplifier assembly 108 preferably includes multiple write amplifiers and multiple sense amplifiers. The write amplifiers preferably are used to write to the memory cells while the sense amplifiers preferably are used to read contents of the memory cells. The RAM block 100 preferably has one write amplifier and one sense amplifier per each column of the memory cell array.

The number of rows and columns of memory cells in the memory cell array 110 typically determines the information storage capacity of the RAM block. The number of bits that the RAM block 100 stores may range from hundreds to hundreds of millions or more. The RAM block 100 preferably also includes a Y decoder 106. The Y decoder 106 preferably receives address signals and preferably selects the columns of memory cells in the memory cell array for reading, writing and refreshing operations. In other words, the Y decoder 106 preferably decodes the address signals to generate write and read bit line select signals to select columns in the memory cell array 110 for writing and reading, respectively.

The RAM block 100 preferably also includes an X decoder 104. The X decoder 104 preferably is used to select rows of the memory cell array 110 for reading, writing and refreshing. The X decoder 104 preferably receives address signals and decodes them to select one or more rows of the memory cell array. The RAM block 100 preferably also includes an address generator/buffer 102. The address generator/buffer 102 either generates addresses within the RAM block or the addresses may be provided by a component or a device outside of the RAM block. The address generator/buffer 102 preferably provides the addresses 114 to the Y decoder 106 and the X decoder 104. The addresses 114 preferably include an access address and a refresh address. The access address preferably is used for normal memory cell access operations such as read and write. The refresh address preferably is used for refreshing the memory cells.

The RAM block 100 preferably also includes an I/O register and buffer 112. The I/O register and buffer 112 preferably is used to temporarily store data bits to be written to the memory cells during writing operations. The I/O register and buffer 112 preferably is also used to temporarily store data bits that are read from the memory cells. The I/O register and buffer 112 preferably interfaces the memory cell array 110 to a memory data bus 116 through the write/sense amplifier assembly 108.

Figure 3:
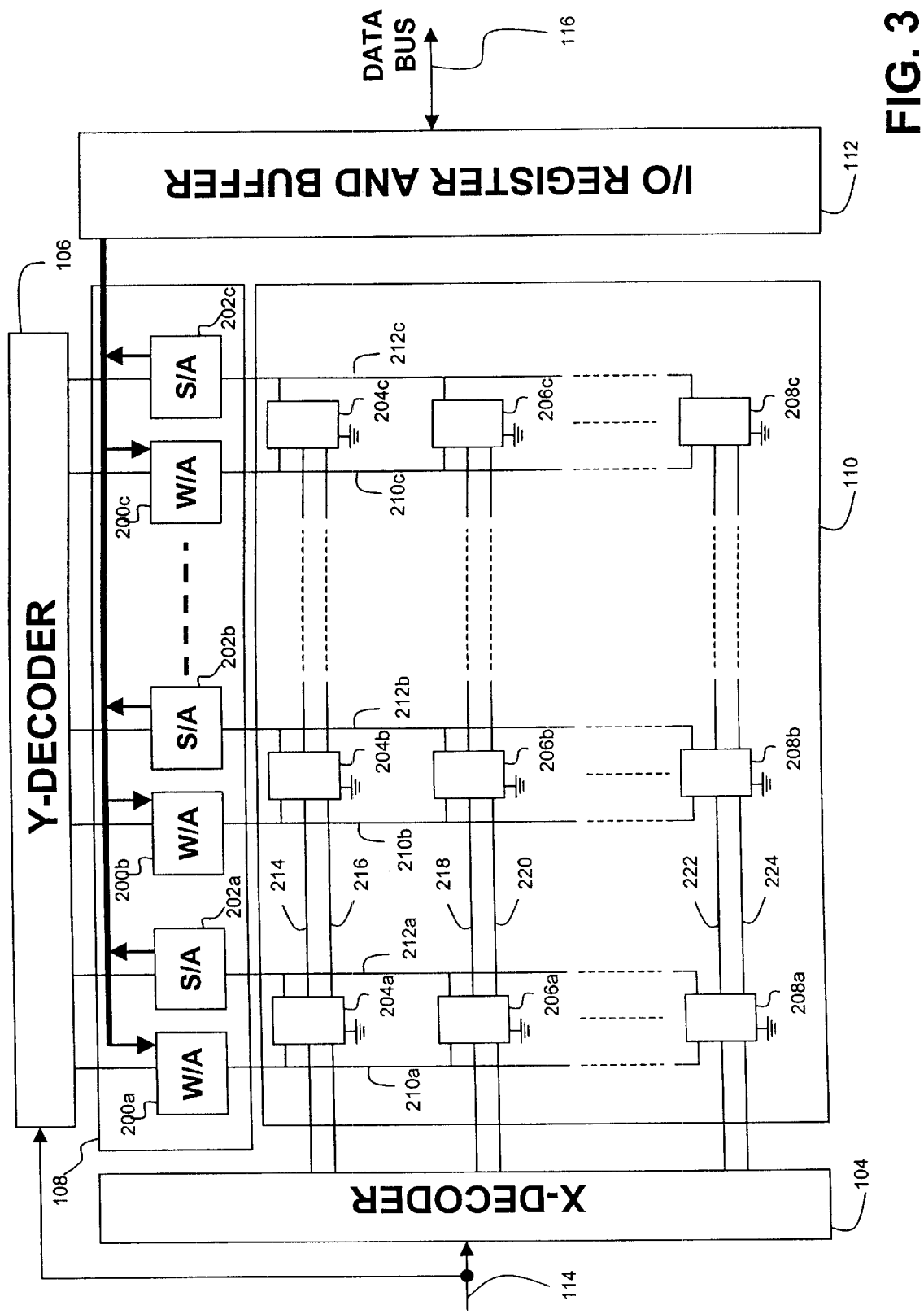
FIG. 3 is a block diagram that illustrates details of a write/sense amplifier assembly and a memory cell array.

FIG. 3 is a block diagram that shows details of the memory cell array 110 and the write/sense amplifier assembly 108 in one embodiment of the present invention. Components of the memory cell array and the write/sense amplifier assembly, such as write amplifiers, sense amplifiers, memory cells, read bit lines, write bit lines, read select lines and write select lines, are shown in FIG. 3 for illustrative purposes only. The RAM block of the present invention may include many more columns of memory cells and corresponding write amplifiers and sense amplifiers. In addition, the RAM block may include many more rows of memory cells.

The write/sense amplifier assembly 108 preferably includes multiple write amplifiers 200a, 200b and 200c. The write sense amplifier assembly 108 preferably also includes multiple sense amplifiers 202a, 202b and 202c. Design and implementation of write amplifiers and sense amplifiers are well known to those with ordinary skill in the art.

In the described embodiment of the present invention, each of the memory cells in the memory cell array 110 preferably is associated with two bit lines, a write bit line and a read bit line. Each of the write bit lines preferably is used to write to the associated memory cells. Each of the read bit lines preferably is used to read from the associated memory cells. The write bit lines preferably are coupled to the write amplifiers and the read bit lines preferably are coupled to the sense amplifiers.

Memory cells 204a, 206a and 208a represent a first column of memory cells in the memory cell array 110. Memory cells 204b, 206b and 208b represent a second column of memory cells in the memory cell array 110. Memory cells 204c, 206c and 208c represent an mth column of memory cells in the memory cell array 110. Write and read bit lines 210a and 212a preferably are coupled to the first column of memory cells. The write bit line 210a preferably couples the write amplifier 200a to each of the memory cells 204a, 206a and 208a. The read bit line 212a preferably couples the sense amplifier 202a to each of the memory cells 204a, 206a and 208a. Memory cells 204b, 206b and 208b preferably are coupled to the write amplifier 200b and read amplifier 202b through a write bit line 210b and a read bit line 212b, respectively. Memory cells 204c, 206c and 208c preferably are coupled to a write amplifier 200c and a read amplifier 202c through a write bit line 210c and a read bit line 212c, respectively. Each of the memory cells preferably is coupled to ground.

The X decoder 104 preferably receives and decodes the addresses 114, and preferably provides read and write select signals through read and write select lines 214 and 216, respectively, to a first row of memory cells 204a, 204b and 204c. The X decoder 104 preferably also provides read and write select signals through read and write select lines 218 and 220, respectively, to a second row of memory cells 206a, 206b and 206c. In addition, the X decoder 104 preferably provides read and write select signals through read and write select lines 222 and 224 to an nth row of memory cells 208a, 208b and 208c.

The Y decoder 106 preferably receives and decodes the addresses 114, and preferably provides write and read bit line select signals to the write amplifiers for writing and sense amplifiers for reading, respectively. The read and write select signals from the X decoder and the write and read bit line select signals from the Y decoder preferably are used to select memory cells for reading and writing.

The X Decoder 104 and the Y Decoder 106 preferably are capable of receiving and decoding an access address and a refresh address at the same time. Thus, two rows of memory cells may be selected simultaneously, one for an access operation and the other for a refresh operation. Since each memory cell is coupled to a write bit line and a read bit line, a memory cell may be read while another memory cell on the same column is being written at the same time. In other words, read and write operations may be performed simultaneously to two different memory cells on the same column.

Figure 4:
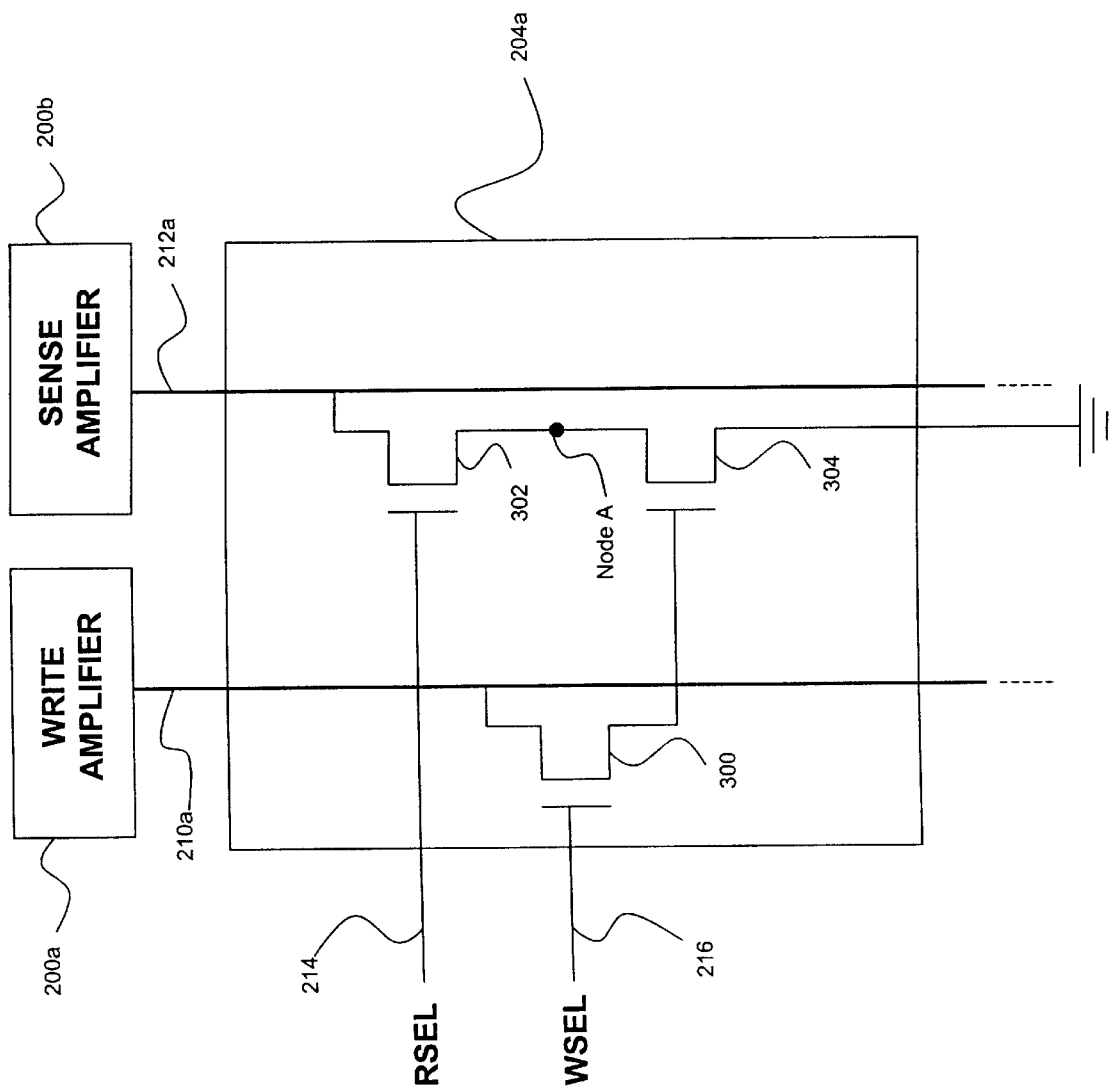
FIG. 4 is a detailed block diagram of a 3T memory cell having n-type transistors.

FIG. 4 is a block diagram of a memory cell 204a including three n-type transistors. In one embodiment of the present invention, the n-type transistors preferably are NMOS transistors. The memory cell 204a preferably is coupled to a write amplifier 200a and a sense amplifier 200b through a write bit line 210a and a read bit line 212a, respectively. The memory cell 204a preferably is also coupled to a read select line 214 and a write select line 216.

The write select line 216 preferably is coupled at a gate of a transistor 300. A drain of the transistor 300 preferably is coupled to a write amplifier 200a over the write bit line 210a. A source of the transistor 300 preferably is coupled to a gate of a transistor 304. A source of the transistor 304 preferably is coupled to ground. A drain of the transistor 304 preferably is coupled to a source of a transistor 302 at node A. The read select line 214 preferably is coupled to a gate of the transistor 302. A drain of the transistor 302 preferably is coupled to the sense amplifier 200b over the read bit line 212a.

When the memory cell 204a is selected for writing, a logic high write select signal preferably is provided at the gate of the transistor 300 over the write select line 216. Meanwhile, the write amplifier 200a preferably provides the write bit line 210a with a data bit to be written to the memory cell 204a. With the logic high write select signal, the transistor 300 preferably turns on, thus allowing the data bit to pass through the transistor 300 and be provided to the gate of the transistor 304.

If the provided data bit is a logic low data bit, the transistor 304 preferably does not turn on, and the ground preferably is not propagated to node A. On the other hand, if the data bit is a logic high data bit, the transistor 304 preferably turns on. At this time, the gate of the transistor 304 preferably is positively charged, and the transistor 304 preferably stays on. In this case, since the source of the transistor 304 is coupled to ground, the voltage level at node A typically approaches ground. In other words, Node A preferably is pulled down to logic low.

Since the write select signal and the read select signal preferably are mutually exclusive, when the write select signal is logic high, the read select signal preferably is logic low. Therefore, a logic low read select signal preferably is provided at the gate of the transistor 302 over the read select line 214. Since the transistor 302 is an n-type transistor, it typically does not turn on, i.e., it turns off, when the logic low read select signal is applied at the gate.

For reading, prior to selecting the memory cell 204a for reading with the read select signal, the sense amplifier 200b preferably pre-charges the read bit line 212a by coupling it to a high voltage, e.g., Vdd. Once the read bit line 212a is precharged to logic high, the high voltage preferably is uncoupled from the bit line 212a. Thus, the read bit line 212a preferably is floating at logic high.

When a logic high read select signal is provided at the gate of the transistor 302, the transistor 302 preferably turns on, allowing the voltage at Node A onto the read bit line 212a to be read by the sense amplifier 200b. At the same time, since the read select signal and the write select signal preferably are mutually exclusive, the write select signal preferably is logic low, and the transistor 300 preferably is not turned on.

If the transistor 304 has been turned on through a write operation with a logic high data bit, the ground is typically propagated to node A and the pre-charged bit line 212a is typically pulled down to logic low during a subsequent read operation. Thus, the sense amplifier 200b typically reads logic low during the read operation. On the other hand, however, if the transistor 304 has not been turned on, ground typically is not propagated to node A, and the pre-charged bit line 212a typically remains at logic high. Thus, the sense amplifier 200b typically reads logic high during the read operation.

Figure 5:
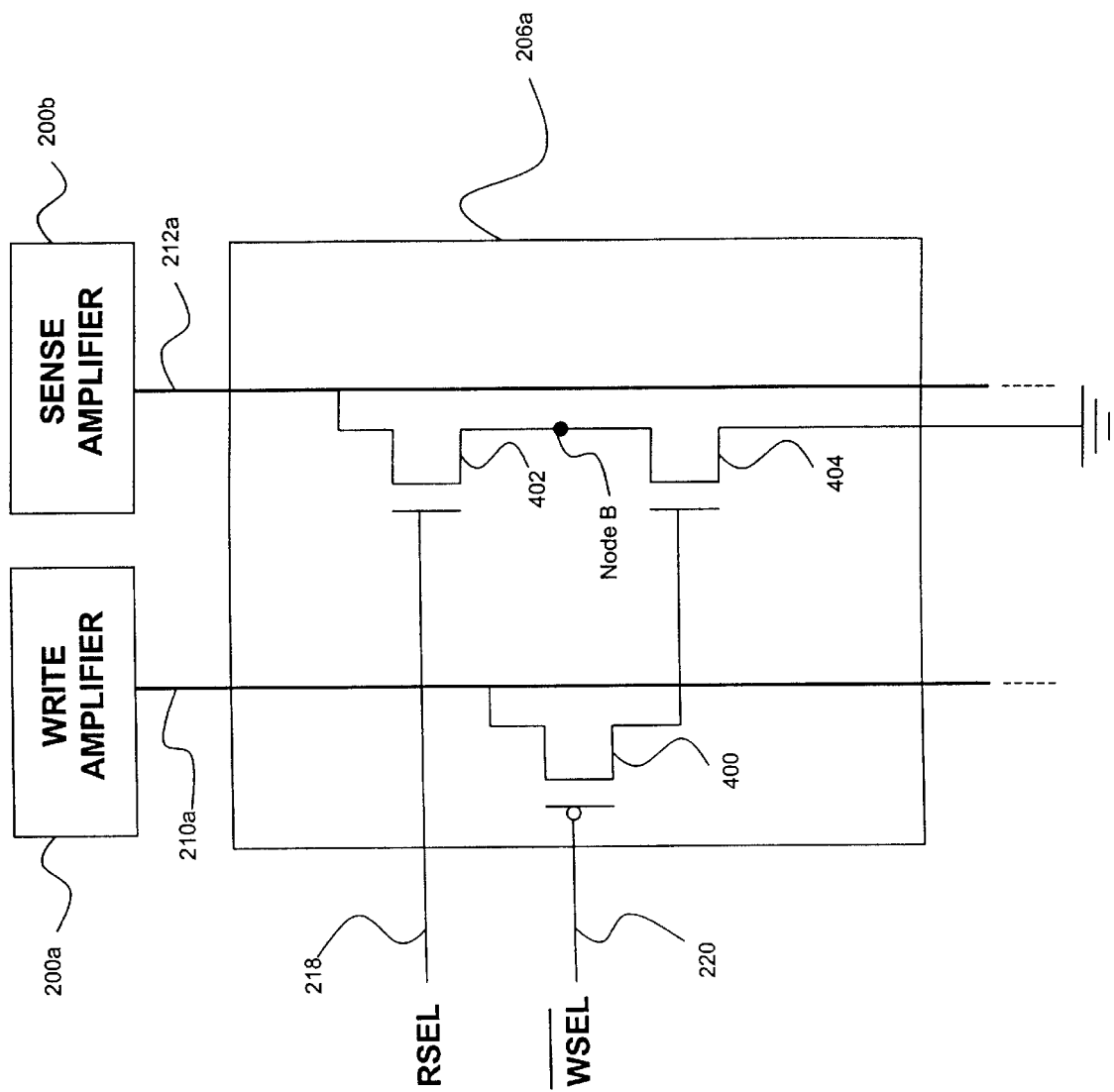
FIG. 5 is a detailed block diagram of a 3T memory cell having n-type and p-type transistors.

FIG. 5 is a block diagram of a memory cell 204a including one p-type transistor and two n-type transistors. In one embodiment of the present invention, the p-type transistor preferably is a PMOS transistor and the n-type transistors preferably are NMOS transistors. The memory cell 206a preferably is coupled to a write amplifier 200a and a sense amplifier 200b through a write bit line 210a and a read bit line 212a, respectively. The memory cell 206a preferably is also coupled to a read select line 218 and a write select line 220.

The write select line 220 preferably is coupled at a gate of a transistor 400. A source of the transistor 400 preferably is coupled to a write amplifier 200a over the write bit line 210a. A drain of the transistor 400 preferably is coupled to a gate of a transistor 404. A source of the transistor 404 preferably is coupled to ground. A drain of the transistor 404 preferably is coupled to a source of a transistor 402 at node B. The read select line 218 preferably is coupled to a gate of the transistor 402. A drain of the transistor 402 preferably is coupled to the sense amplifier 200b over the read bit line 212a.

When the memory cell 206a is selected for writing, a logic low write select signal preferably is provided at the gate of the transistor 400 over the write select line 220. Meanwhile, the write amplifier 200a preferably provides the write bit line 210a with a data bit to be written to the memory cell 206a. With the logic low write select signal, the transistor 400 preferably turns on, allowing the data bit to pass through the transistor 400 and be provided to the gate of the transistor 404.

If the provided data bit is a logic low data bit, the transistor 404 preferably does not turn on, and the ground preferably is not propagated to node B. On the other hand, if the data bit is a logic high data bit, the transistor 404 preferably turns on. At this time, the gate of the transistor 404 preferably is positively charged, and the transistor 404 preferably stays on. In this case, since the source of the transistor 404 is coupled to ground, the voltage level at node B typically approaches ground. In other words, Node B preferably is pulled down to logic low.

When the write select signal is logic low, the read select signal preferably is logic low as well. Therefore, a logic low read select signal preferably is provided at the gate of the transistor 402 over the read select line 218. Since the transistor 402 is an n-type transistor, it typically does not turn on, i.e., it turns off, when the logic low read select signal is applied at the gate.

For reading, prior to selecting the memory cell 206a for reading with the read select signal, the sense amplifier 200b preferably pre-charges the read bit line 212a by coupling it to a high voltage, e.g., Vdd. Once the read bit line 212a is pre-charged to logic high, the high voltage preferably is uncoupled from the bit line 212a. Thus, the read bit line 212a preferably is floating at logic high.

When a logic high read select signal is provided at the gate of the transistor 402, the transistor 402 preferably turns on, allowing the voltage at Node B onto the read bit line 212a to be read by the sense amplifier 200b. At the same time, the write select signal preferably is logic high, and the transistor 400 preferably does not turn on.

If the transistor 404 has been turned on through a write operation with a logic high data bit, the ground typically is propagated to node B and the pre-charged bit line 212a typically is pulled down to logic low during a subsequent read operation. Thus, the sense amplifier 200b typically reads logic low during the read operation. On the other hand, however, if the transistor 404 has not been turned on, ground typically is not propagated to node B, and the pre-charged bit line 212a typically remains at logic high. Thus, the sense amplifier 200b typically reads logic high during the read operation.

In order to prevent losing data through charge leakage, a continuous refresh mechanism is preferably provided in one embodiment of the present invention so that the contents of the memory cells at node A in FIG. 4 and node B in FIG. 5 preferably are refreshed periodically. During a refresh operation, contents of memory cells preferably are read and then written back to the same address. A collision avoidance mechanism preferably is used to prevent conflicts between refresh and access operations. The collision avoidance mechanism preferably is used to determine whether the refresh operation and the access operation are attempting to read/write at the same address. If the refresh address is the same as the access address, the collision avoidance mechanism preferably uses a pre-determined algorithm to update the refresh address. In other embodiments, the collision avoidance mechanism may be used to update the access address or both the access address and the refresh address.

Figure 6:
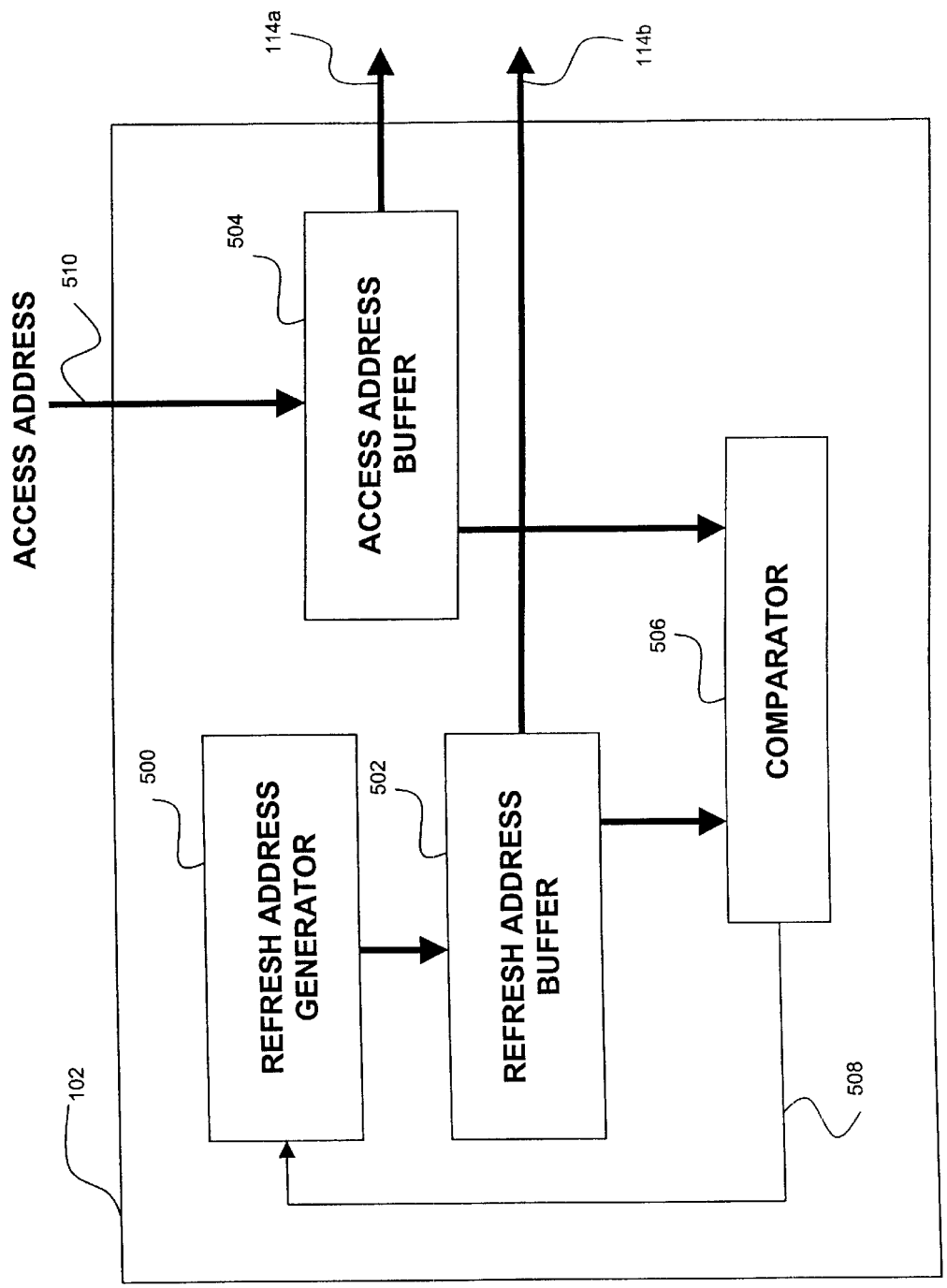
FIG. 6 is a block diagram of an address generator/buffer.

FIG. 6 is a block diagram of an address generator/buffer, which may be similar to the address generator/buffer 102 of FIG. 2, in one embodiment of the present invention. The address generator/buffer in this embodiment preferably provides an access address 114a as well as a refresh address 114b. The refresh address preferably is used to refresh memory cells, such as a row of memory cells, while the access address preferably is used to access memory cells, such as a row of memory cells, for read and write operations.

The address generator/buffer preferably includes a refresh address generator 500. The refresh address generator 500 preferably is used to generate the refresh address, which preferably is used to refresh the contents of corresponding memory cells to prevent loss of information due to charge leakage. The refresh address generator 500 preferably generates refresh addresses and preferably provides them to a refresh address buffer 502. In turn, the refresh address buffer 502 preferably provides the refresh address to a comparator 506 and to a X decoder and a Y decoder, which may be similar to the X decoder 104 and Y decoder 106 of FIG. 2, over the address bus 114b.

The address generator/buffer preferably also includes an access address buffer 504. The access address buffer 504 preferably receives an access address 510 and preferably stores it. The access address buffer 504 then preferably provides the access address to the comparator 506 and to the X decoder and the Y decoder over the address bus 114a. The access address 510 may be generated internally to a RAM block, such as the RAM block 100 of FIG. 2. The access address 510 may also be provided to the RAM block, for example, by a CPU.

The comparator 506 preferably is a part of the collision avoidance mechanism. The refresh address and the access address preferably are compared at the comparator 506. If the refresh address and the access address match, i.e., they are the same, the comparator 506 preferably provides a match signal 508 to the refresh address generator 500. Since the refresh address and the access address are used to address the same memory cell array, the refresh and access operations on the same address preferably are not performed simultaneously. Therefore, when the refresh address matches the access address as indicated by the match signal 508, the refresh address generator preferably updates the refresh address using a pre-determined algorithm. For example, the pre-determined algorithm may be incrementing or decrementing the refresh address by one.

Figure 7:
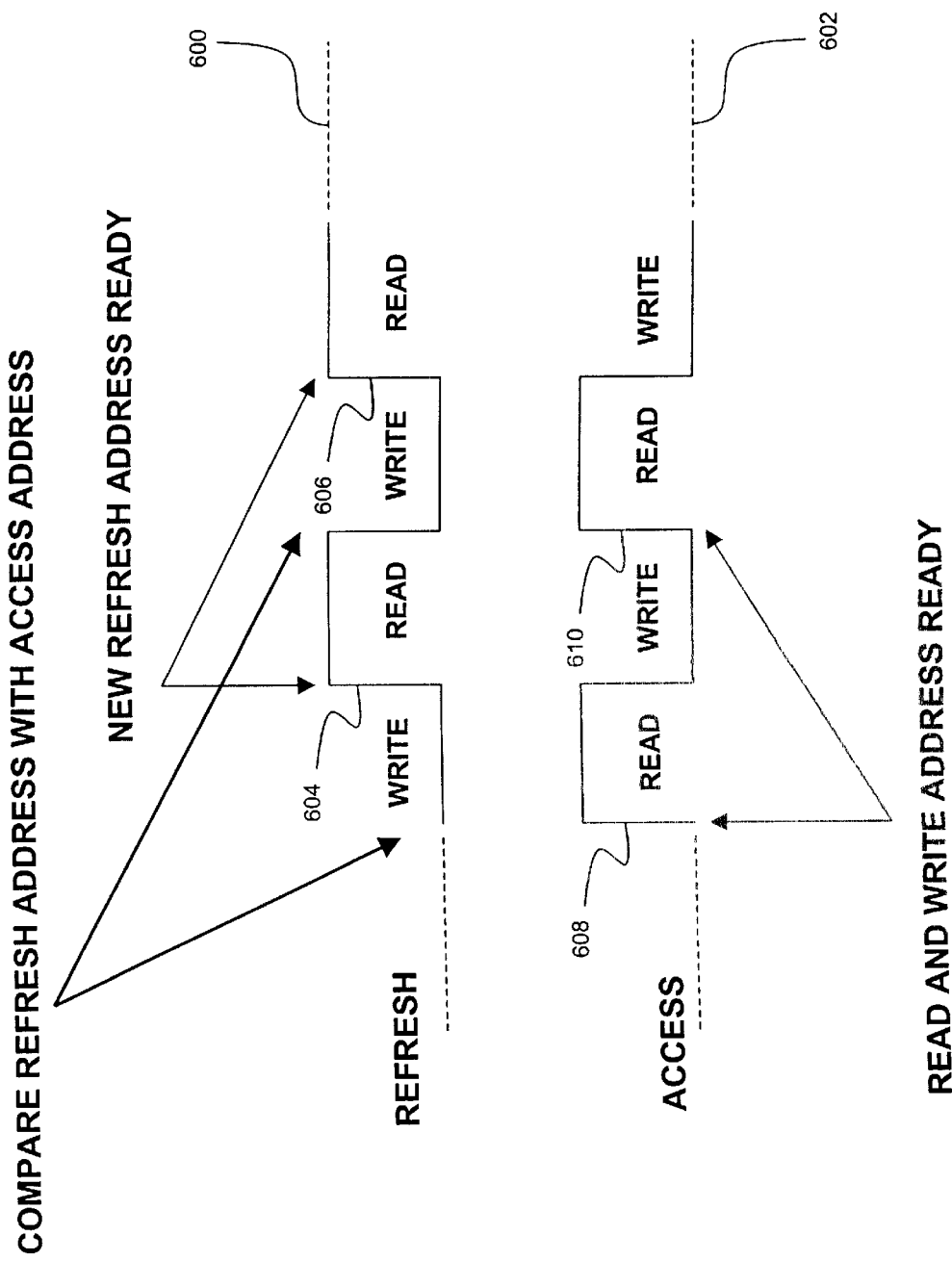
FIG. 7 is a timing diagram that illustrates timing relationship between refresh cycles and access cycles.

FIG. 7 is a timing diagram that illustrates the relationship between a refresh cycle on refresh time line 600 and an access cycle on access time line 602. During the refresh cycle, a read operation preferably is performed followed by a write operation. During the access cycle, either a read operation or a write operation may be performed. Read and write operations preferably are scheduled such that the same type of operation preferably is not performed at the same time by the refresh and access cycles. For example, while a read operation of the refresh cycle is being performed, a write operation of the access cycle preferably is performed, and vice versa.

At time 608, a current access address preferably is made ready for a read or write operation. A new refresh address preferably is generated by a refresh address generator, such as the refresh address generator 500 of FIG. 6. At this time, the access address and the refresh address preferably are compared with one another in a comparator, such as the comparator 506 of FIG. 6. If the addresses match, the refresh address preferably is updated using a pre-determined algorithm to avoid conflict with the access address. Then, while a read operation (provided that the access operation is the read operation) is performed in the access cycle, a previous refresh cycle preferably is completed, wherein data read from the previous refresh address preferably is written back to the same address.

At time 604, the current refresh address preferably is made ready for refresh operation including read and write operations. Then, while a write operation (provided that the access operation is the write operation) is performed in the access cycle, a new refresh cycle preferably is started by reading from the current refresh address.

At time 610, new address for each of the next refresh cycle and the next access cycle preferably is generated, and the new access address preferably is made ready. At this time, the new refresh address preferably is compared with the new access address to avoid collision. If the new refresh address matches the new access address, the refresh address preferably is updated using a pre-determined algorithm. When the refresh address is not the same as the access address, the refresh address preferably is not updated. The new refresh address preferably is made ready at time 606 after a read operation (provided that the access operation is the read operation) is performed in the access cycle and a write operation is performed in the refresh cycle, respectively.

Figure 8:
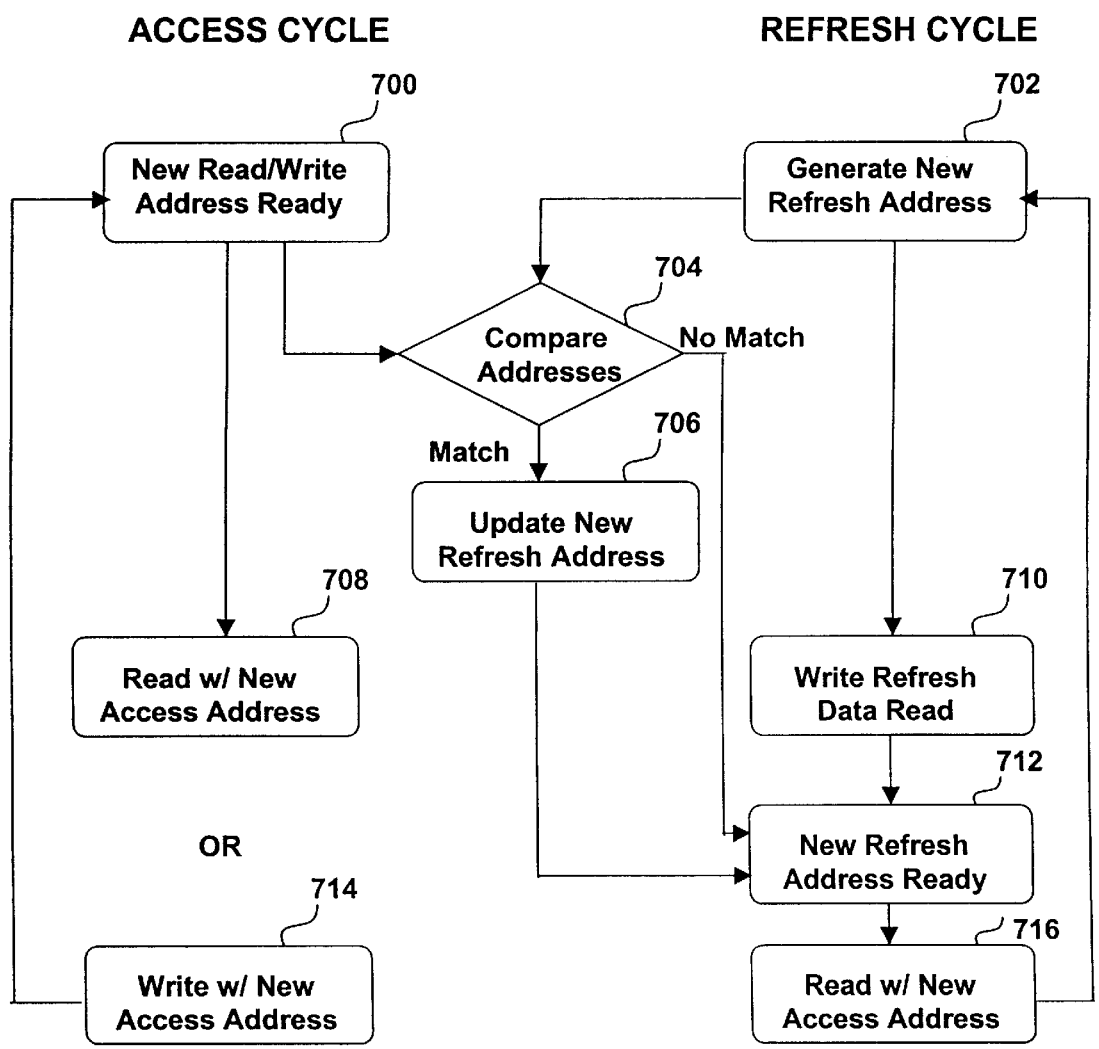
FIG. 8 is a flow diagram that illustrates timing relationship between a refresh cycle and an access cycle.

FIG. 8 is a flow diagram that illustrates a relationship between an access cycle and a refresh cycle. In step 700 of the access cycle, a new read/write address preferably is generated or received, and made ready. Meanwhile, in step 702 of the refresh cycle, a new refresh address preferably is generated. The new read/write address preferably is compared with the new refresh address in step 704. If the addresses match, i.e., if the read/write address is same as the refresh address, the new refresh address preferably is updated in step 706 using a pre-determined algorithm. If they do not match, the refresh address preferably is not updated.

In the access cycle, if a read operation has been selected, the new access address preferably is read in step 708. At the same time in the refresh cycle, a refresh data read from a previous refresh address preferably is written back to the previous refresh address in step 710 to complete the previous refresh cycle. In step 712, new refresh address preferably is made ready. This new refresh address may be the new refresh address generated in step 702 or it may be the updated new refresh address from step 706.

In the access cycle, if a write operation has been selected, the new access address preferably is written in step 714 with data bits from write amplifiers. At the same time in the refresh cycle, the new refresh address (or the updated new refresh address) preferably is read. At this point, another new read/address preferably is made ready in step 700 and another new refresh address preferably is generated in step 702 to start another new access cycle and another new refresh cycle, respectively.

Accordingly, the present invention provides a RAM block, of an SOC device or a RAM chip, which has 3T memory cell configuration and simultaneous access and refresh operations. Although this invention has been described in certain specific embodiments, many additional modifications and variations would be apparent to those skilled in the art.

For example, the SOC device 2 of FIG. 1 may be a central processing unit (CPU) or a digital signal processing (DSP) chip including on-chip RAM. The SOC device 2 of FIG. 1 may also be a device for performing any other function that uses on-chip memory, such as an integrated circuit chip containing a graphics display system or any other functional system. In addition, the pre-determined algorithm for updating the refresh address may be different from incrementing or decrementing by one. Further, different types of transistors other than NMOS or PMOS transistors may be used, or different combinations of NMOS and PMOS transistors may be used.

It is therefore to be understood that this invention may be practiced otherwise than as specifically described. Thus, the present embodiments of the invention should be considered in all respects as illustrative and not restrictive, the scope of the invention to be determined by the appended claims and their equivalents rather than the foregoing description.

What is claimed is:

1. A memory circuit comprising:
   a memory cell, the memory cell comprises
      a first transistor having a gate, a first terminal and a second terminal, the first terminal being coupled to a write bit line;
      a second transistor having a gate, a first terminal and a second terminal, the gate being coupled to the second terminal of the first transistor; and
      a third transistor having a gate, a first terminal and a second terminal, the first terminal being coupled to a read bit line and the second terminal being coupled to the first terminal of the second transistor.

2. The memory circuit of claim 1 wherein the gate of the first transistor is coupled to a write select line.

3. The memory circuit of claim 2 wherein the first terminal of the first transistor is coupled to a write amplifier over the write bit line.

4. The memory circuit of claim 3 wherein the second terminal of the second transistor is coupled to ground.

5. The memory circuit of claim 4 wherein the gate of the third transistor is coupled to a read select line.

6. The memory circuit of claim 5 wherein the first terminal of the third transistor is coupled to a sense amplifier over the read bit line.

7. The memory circuit of claim 1 wherein the first transistor, the second transistor and the third transistor are n-type transistors.

8. The memory circuit of claim 1 wherein at least one of the first transistor, the second transistor and the third transistor is a p-type transistor.

9. The memory circuit of claim 1 wherein the memory cell can be refreshed while the second memory cell is being read substantially simultaneously.

10. A memory circuit comprising:
    a column of memory cells, each memory cell being coupled to a read bit line and a write bit line and comprising:
       a first transistor having a gate, a first terminal and a second terminal, the first terminal being coupled to the write bit line;
       a second transistor having a gate, a first terminal and a second terminal, the gate being coupled to the second terminal of the first transistor; and
       a third transistor having a gate, a first terminal and a second terminal, the first terminal being coupled to the read bit line and the second terminal being coupled to the first terminal of the second transistor,
    wherein a first memory cell on the column can be refreshed while a second memory cell on the column is being written substantially simultaneously,
    wherein the memory circuit comprises a collision avoidance mechanism, which prevents an attempt to perform both refresh and access operations on a same memory cell substantially simultaneously, and
    wherein the write bit line is used for writing to the memory cells during both refresh and write operations, and the read bit line is used for reading from the memory cells for both refresh and read operations.

11. The memory circuit of claim 10 wherein the gate of the first transistor in each memory cell is coupled to one of a plurality of write select lines.

12. The memory circuit of claim 11 wherein the first terminal of the first transistor in each memory cell is coupled to a write amplifier over the write bit line.

13. The memory circuit of claim 12 wherein the second terminal of the second transistor in each memory cell is coupled to ground.

14. The memory circuit of claim 13 wherein the gate of the third transistor in each memory cell is coupled to one of a plurality of read select lines.

15. The memory circuit of claim 14 wherein the first terminal of the third transistor in each memory cell is coupled to a sense amplifier over the read bit line.

16. The memory circuit of claim 10 wherein the first transistor, the second transistor and the third transistor of each memory cell are n-type transistors.

17. The memory circuit of claim 10 wherein at least one of the first transistor, the second transistor and the third transistor in each memory cell is a p-type transistor.

18. The memory circuit of claim 10 wherein the first memory cell on the column can be refreshed while the second memory cell on the column is being read substantially simultaneously.

* * * * *

UNITED STATES PATENT AND TRADEMARK OFFICE
CERTIFICATE OF CORRECTION

PATENT NO. : 6,600,677 B2
DATED : July 29, 2003
INVENTOR(S) : Cyrus Afghahi et al.

It is certified that error appears in the above-identified patent and that said Letters Patent is hereby corrected as shown below:

<u>Column 10,</u>
Line 13, delete "second transistor.", insert

--second transistor;
    a second memory cell on a same column of the memory circuit as the memory cell is coupled to the write bit line and the read bit line,
    wherein the memory cell can be refreshed while the second memory cell is being written substantially simultaneously,
    a collision avoidance mechanism, which prevents an attempt to perform both refresh and access operations on the memory cell substantially simultaneously, and
    wherein the write bit line is used for writing to the memory cell during both refresh and write operations, and the read bit line is used for reading from the memory cell for both refresh and read operations.--

Signed and Sealed this

Fourth Day of January, 2005

JON W. DUDAS
*Director of the United States Patent and Trademark Office*